United States Patent
Low et al.

(10) Patent No.: US 8,536,717 B2
(45) Date of Patent: Sep. 17, 2013

(54) INTEGRATED CIRCUIT PACKAGE AND METHOD OF ASSEMBLING AN INTEGRATED CIRCUIT PACKAGE

(75) Inventors: Shin S. Low, Cupertino, CA (US); Inderjit Singh, Saratoga, CA (US)

(73) Assignee: XILINX, Inc., San Jose, CA (US)

( * ) Notice: Subject to any disclaimer, the term of this patent is extended or adjusted under 35 U.S.C. 154(b) by 1 day.

(21) Appl. No.: 13/347,327

(22) Filed: Jan. 10, 2012

(65) Prior Publication Data
US 2013/0175709 A1 Jul. 11, 2013

(51) Int. Cl.
*H01L 29/40* (2006.01)

(52) U.S. Cl.
USPC .............. 257/784; 257/E23.033; 257/E23.02; 257/E21.502; 257/E21.504

(58) Field of Classification Search
USPC ........... 257/784, E21.502, E21.503, E21.504, 257/E21.506, E21.518, E23.02, E23.021, 257/E23.033, E23.049
See application file for complete search history.

(56) References Cited

U.S. PATENT DOCUMENTS

| | | | |
|---|---|---|---|
| 5,736,792 A * | 4/1998 | Orcutt | 257/783 |
| 2005/0085019 A1 | 4/2005 | Batish et al. | |
| 2005/0121798 A1* | 6/2005 | Batish | 257/773 |
| 2009/0032972 A1 | 2/2009 | Okubo et al. | |

* cited by examiner

*Primary Examiner* — Zendra V. Smith
*Assistant Examiner* — Paul Patton
(74) *Attorney, Agent, or Firm* — John J. King

(57) ABSTRACT

A method of assembling an integrated circuit package is disclosed. The method comprises placing a die on a substrate of the integrated circuit package; coupling a plurality of wire bonds from a plurality of bond pads on the die to corresponding bond pads on the substrate; applying a non-conductive material to the plurality of wire bonds; and encapsulating the die and the plurality of wire bonds. An integrated circuit package is also disclosed.

20 Claims, 5 Drawing Sheets

INTEGRATED CIRCUIT PACKAGE AND METHOD OF ASSEMBLING AN INTEGRATED CIRCUIT PACKAGE

FIELD OF THE INVENTION

The present invention relates generally to integrated circuits, and in particular, to an integrated circuit package and a method of assembling an integrated circuit package.

BACKGROUND

Manufacturers often attempt to reduce the cost of their products while maintaining the same quality. In an attempt to reduce the cost of producing an integrated circuit, there are a variety of areas in the manufacturing process to attempt to reduce cost. For example, it may beneficial to reduce the amount of material, and particularly the amount of expensive materials, required to produce the integrated circuit. One expensive material used in the production of integrated circuits is gold used in wire bonds between bond pads on a die and bond pads on a substrate.

However, whenever making any reduction in materials, it is important to ensure that the reduction does not adversely affect the performance of the integrated circuit. For example, while attempts could be made to reduce the lengths of bond wires, such a reduction may result in shorting of the wire bonds. That is, a reduction in the length of wire bonds of an integrated circuit may lead to a significant decrease in the wire-to-wire gap. With reduced wire lengths, adjacent wire bonds can make contact, resulting in wire shorts. Further, conventional encapsulation or molding techniques can result in the "sweeping" or movement of wires after the molding process, leading to wire shorts. Such wire shorts may be more likely in regions having a greater density of wire bonds, where the wires may have very little gap between them. Total yield loss due to wire short can be as high as 2.5% to 7% of total assembly yield loss.

SUMMARY

A method of assembling an integrated circuit package is described. The method comprises placing a die on a substrate of the integrated circuit package; coupling a plurality of wire bonds from a plurality of bond pads on the die to corresponding bond pads on the substrate; applying a non-conductive material to the plurality of wire bonds; and encapsulating the die and the plurality of wire bonds.

The method may further comprise curing the non-conductive material by heating the non-conductive material. The method may also comprise identifying one or more regions of wirebonds having a high density of wire bonds, wherein applying a non-conductive material to the plurality of wire bonds comprises coating wire bonds in the one or more regions having a high density of wire bonds. Applying a non-conductive material to the plurality of wire bonds may comprise coating a first portion of the plurality of wire bonds in a first application. The method may further comprise coating a second portion of the plurality of wire bonds with the non-conductive material in a second application, wherein coating a second portion of the plurality of wire bonds with the non-conductive material in a second application comprises coating the second portion of the wire bonds of the plurality of wire bonds exceeds a predetermined length.

According to an alternate embodiment, a method of assembling an integrated circuit package comprises placing a die on a substrate of the integrated circuit package; coupling a plurality of wire bonds from a plurality of bond pads on the die to corresponding bond pads on the substrate; identifying a region of the plurality of wire bonds of an integrated circuit requiring protection against shorting; and selectively applying a non-conductive material to the region of the plurality of wire bonds.

The method may further comprise curing the non-conductive material by heating the non-material. Identifying a region of the plurality of wire bonds of an integrated circuit may comprise identifying a region of the plurality of wire bonds having a predetermined density of wire bonds, or identifying a region of the plurality of wire bonds having a predetermined length. Selectively applying a non-conductive material to the region of the plurality of wire bonds may comprise selectively applying a non-conductive material to a first portion of the plurality of wire bonds with the non-conductive material in a first application. The method may further comprise coating a second portion of the plurality of wire bonds with the non-conductive material in a second application, and encapsulating the die and the plurality of wire bonds.

An integrated circuit package is also described. The integrated circuit package comprises a substrate; at least one die positioned on the substrate; and a plurality of wire bonds coupling a plurality of bond pads on the at least one die to corresponding bond pads on the substrate; wherein at least a portion of the plurality of wire bonds are coated with a non-conductive material to prevent shorting between wire bonds of the plurality of wire bonds.

The plurality of wire bonds may be in a region of wire bonds having a predetermined density. Further, the plurality of wire bonds may be coated with a first coating on first segments of the plurality of wire bonds and with a second coating on second segments of the plurality of wire bonds. For each wire bond of the plurality of wire bonds having the non-conductive material, a bead may be formed on the wire bond. The at least a portion of the plurality of wire bonds may comprise a first plurality of wire bonds in a first region and a second plurality of wire bonds in a second region. The non-conductive material may comprise an epoxy.

DETAILED DESCRIPTION

The various integrated circuit packages and methods of assembling an integrated circuit package set forth below enable high volume manufacturing of high density and fine pitch wire bond designs with high yield and low cost. A high density and fine pitch wire bond design typically has very minimal wire-to-wire gap, where wire bonds easily touch each other, resulting in shorts after an epoxy encapsulation is applied in a molding process. As will be described in more detail below, a non-conductive material is applied to wire bonds to hold the wire bonds in place during the molding process, and maintain the wire-to-wire gap before and after the molding process. The non-conductive material may be selectively dispensed over wire bonds in predetermined regions having a high density of wire bonds, for example.

Figure 1:
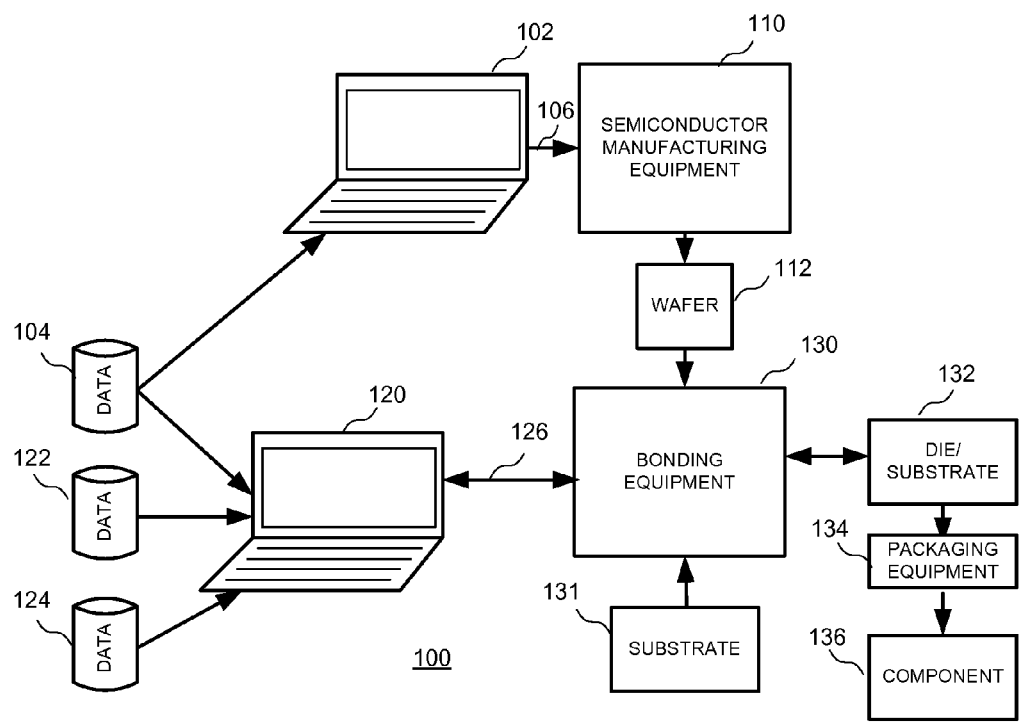
FIG. 1 is a block diagram of system for producing an integrated circuit device according to an embodiment.

Turning first to FIG. 1, a block diagram of system for producing an integrated circuit device is shown. The system 100 comprises computer-aided design (CAD) equipment 102, which could be any computer adapted to run CAD software. The CAD equipment 102 receives data, such as a master pinlist 104, and is coupled by a communication link 106 to semiconductor manufacturing equipment 110. The semiconductor manufacturing equipment 110 generates a wafer 112 having a plurality of die, as is well known in the art.

CAD equipment 120, which is also coupled to receive the master pinlist 104, receives a bonding diagram 122 and substrate artwork 124. The CAD equipment 120 is coupled by a communication link 126 to bonding equipment 130. The communication links 106 and 126 could be any wired or wireless communication link. The bonding equipment generally provides wire bonds from a die from the wafer 112 to a substrate receiving the die, as will be described in more detail in reference to other figures. The die/substrate 132 is coupled to packaging equipment 134 which generates a finished component 136, such as an integrated circuit package. Although the system of FIG. 1 provides various elements required for producing an integrated circuit package, it should be understood the elements shown in FIG. 1 could be combined, or additional elements could be provided. Further, additional details regarding the operation of the system of FIG. 1 are provided below in reference to other figures.

Figure 2:
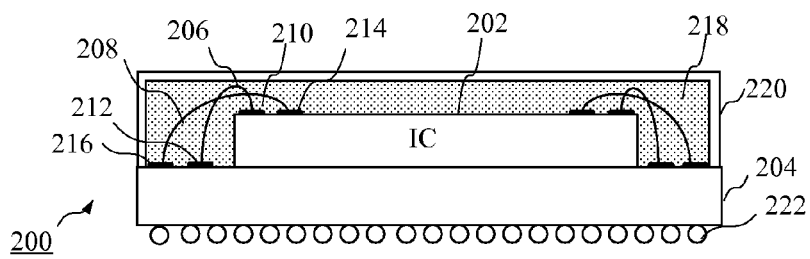
FIG. 2 is a cross-sectional view of an integrated circuit device according to an embodiment.

Turning now to FIG. 2, a cross-sectional view of an integrated circuit package 200 is shown. In particular, an integrated circuit die 202 is coupled to a substrate 204 by way of a plurality of wire bonds. The wire bonds shown in FIG. 2 include wire bonds 206 and 208, where wire bond 206 is coupled between a bond pad 210 on the integrated circuit die 202 and bond pad 212 on the substrate 204. The wire bond 208 is coupled between a bond pad 214 on the integrated circuit die 202 and a bond pad 216. While many more bond pads and wire bonds are commonly implemented in an integrated circuit package, representative wire bonds are shown for purposes of explaining various aspects of coating wire bonds with a non-conductive material. A molding material 218, such as a thermosetting polymer, is applied to the integrated circuit die 202 and the substrate 204 to encapsulate the wire bonds as shown. However, as will be described in more detail below, the wire bonds may be coated with a non-conductive material before the molding material 218 is added, as will be described in more detail below in reference to the various embodiments.

Figure 3:
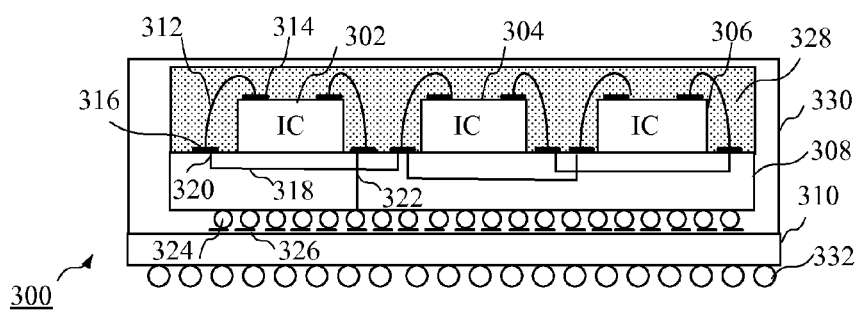
FIG. 3 is a block diagram of a cross-sectional view of an integrated circuit device according to an alternate embodiment.

As shown in the embodiment of FIG. 3, multiple integrated circuit dies are implemented in a single integrated circuit package 300. In particular, each of an integrated circuit die 302, an integrated circuit die 304, and an integrated circuit die 306 are coupled to an interposer circuit 308 by way of wire bonds to bond pads on the interposer. The interposer circuit 308 is coupled to a substrate 310. For example, a wire bond 312 is coupled between a bond pad 314 on the integrated circuit die 302 to a bond pad 316. Interconnects 318 and vias 320 enable the connection of the various bond pads on the interposer circuit 308. Other vias, such as via 322, enable the connection from bond pads on the interposer circuit 308 to solder bumps 324 on the interposer circuit 308 which are coupled to corresponding bond pads 326 on the substrate 310. While the interposer circuit 308 is coupled to the substrate 310 by way of solder bumps 324, wire bonds could instead be used to couple to interposer circuit 308 to the substrate 310. A molding material 328 is also applied over the integrated circuit dies 302-306 and the substrate 302. A cap 330 is coupled to the substrate 310 to encapsulate elements of the integrated circuit package 300.

Figure 4:
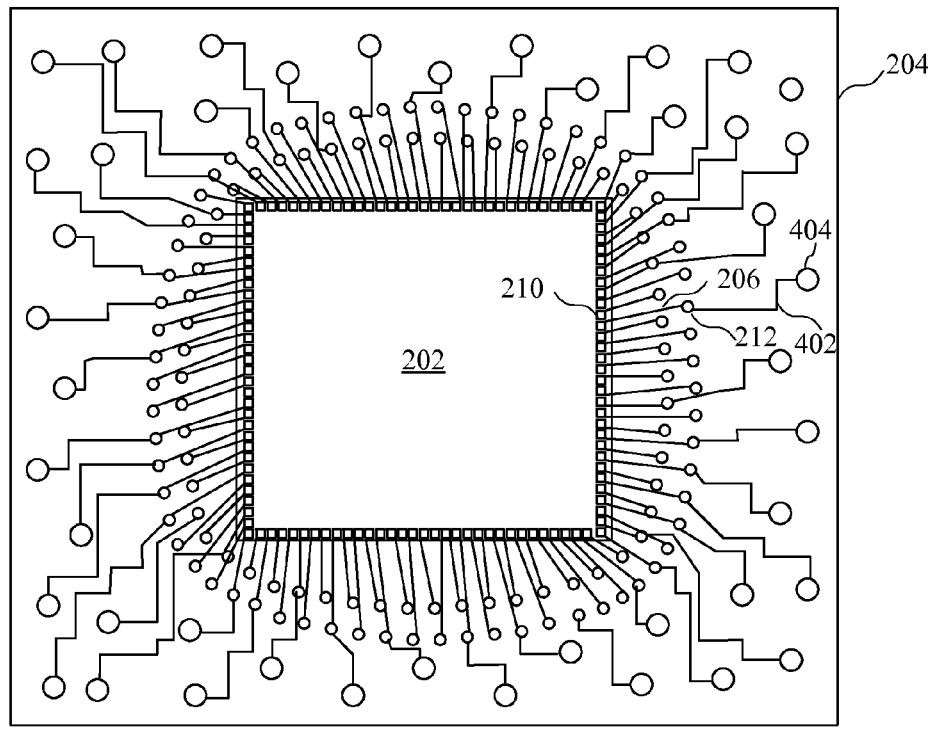
FIG. 4 is a top plan view showing wire bonds of an integrated circuit device according to an embodiment.

Turning now to FIG. 4, a top plan view shows wire bonds of an integrated circuit device. In particular, the embodiment of FIG. 4 shows the arrangement of connections between the integrated circuit die 202 and the substrate 204. As can be seen, the bond pads 210 on the integrated circuit die 202 are coupled to bond pads 212 on the substrate by way of wire bonds 206. Metal traces 402 on the substrate 204 enable coupling the bond pads 212 to vias 404. While the traces 402 are shown on the top of the substrate, it should be understood that the substrate may be a multilayer substrate. Accordingly, some of the bond pads 212 on the substrate are positioned on a via which couples the bond pad to a trace on another layer of the substrate, as is well known. Further, while only a single row of bond pads 210 is shown on the integrated circuit die 202, multiple rows of bond pads may be implemented, as shown in FIG. 2.

Figure 5:
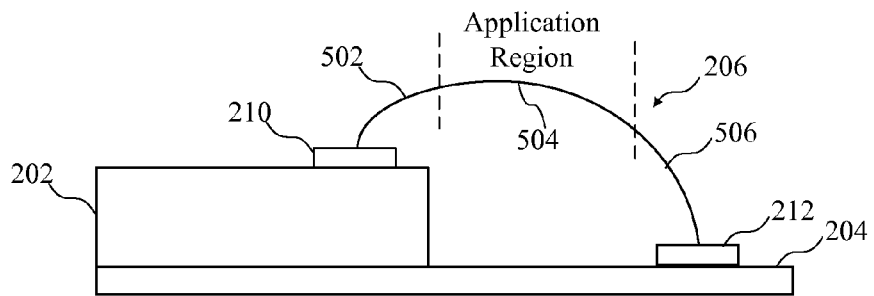
FIG. 5 is a cross-sectional view of an integrated circuit device receiving a single application of a non-conductive coating according to an embodiment.

Turning now to FIG. 5, a cross-sectional view of an integrated circuit device receiving a single application of a non-conductive coating is shown based upon the embodiment of FIG. 2. As can be seen in FIG. 5, the wire bond 206 is divided into various segments, including a first segment 502 between the bond pad 210 of the integrated circuit die 202 and a second segment 504 which receives a non-conductive coating. A third segment 506 between the second segment 504 and the bond pad 212 may not receive any coating of non-conductive material. As will be described in more detail below, the coating of non-conductive material may be applied to a single section, shown here as the segment 504, which is likely to exhibit "wire sweep" (or movement of the wires) as a result of the molding process. That is, sections of the wire bond away from bond pads 210 and 212 are more likely to move during the application of the molding material. It is a result of the wire sweep of the wire bonds that adjacent wire bonds may unintentionally make contact and result in a short circuit. According to one embodiment, the conductive coating covers approximately 50%-75% of the length of the wire. As will be further described below, it is the coating of non-conductive material on the wire bonds that prevents the wire bonds from moving excessively such that short circuits occur.

Figure 6:
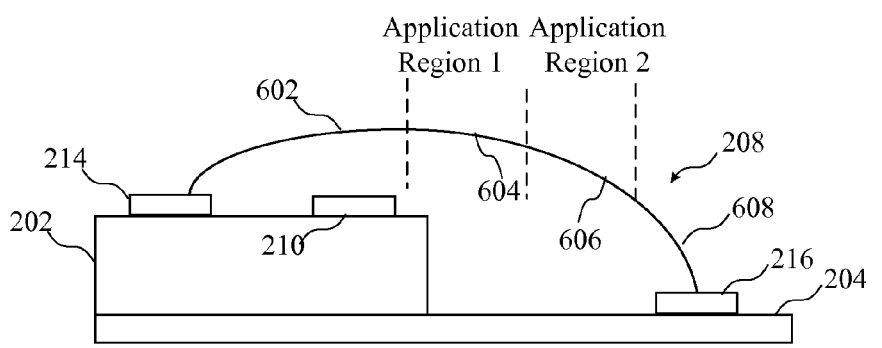
FIG. 6 is a block diagram of a cross-sectional view of an integrated circuit device receiving multiple applications of a non-conductive coating according to an embodiment.

In some arrangements, certain wire bonds may be longer. As shown in the embodiment of FIG. 2 which has two rows of bond pads on the integrated circuit die 202, the wire bond 208 coupled between the bond pads 214 and 216 is generally longer than the wire bond 206. Accordingly, two separate applications of a non-conductive coating to the wire bond 206 may be necessary to adequately coat wire bond to prevent wire sweeping. As will be described in more detail below, it may be beneficial to coat a portion of a wire according to predetermined criteria. Accordingly, to cover the appropriate region to prevent wire sweeping, it may be necessary to provide a coating of non-conductive material in multiple applications, such as an application region 1 and an application region 2, as shown in FIG. 6. As can be seen in FIG. 6, the wire bond 208 is divided into various segments, including a first segment 602 between the bond pad 214 of the integrated circuit die 202 and a second segment 604 which receives a non-conductive coating. A third segment 606 receiving a non-conductive coating in a second application is coupled between the first segment 602 and a remaining segment 608 coupled to the bond pad 216. While two application regions are shown, it should be understood that a greater number of applications may be required depending upon various factors, including the length of the wire bonds and the composition of the non-conductive material. The number of application regions and the locations of the application regions could be determined empirically.

Figure 7:
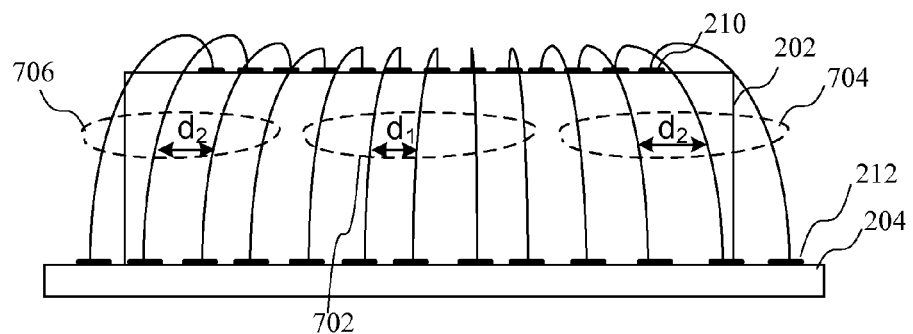
FIG. 7 is a side view of an integrated circuit device having wire bonds of varying densities in different regions according to an embodiment.

Turning now to FIG. 7, a side view of an integrated circuit device having wire bonds of varying density in different regions is shown. According to various embodiments, a coating of the non-conductive material may be selectively applied to predetermined regions of wire bonds meeting criteria for receiving the non-conductive coating. For example, a coating of the non-conductive material may be applied in regions generally having a higher density of wire bonds. As shown in FIG. 7, three regions 702-706 of wire bonds are shown, where the density of the regions could be defined as the number of wire bonds for a given length of the substrate. As can be seen, 5 wire bonds are located in the middle region 702, while only 4 wire bonds are found in the side regions 704 and 706 near the ends of the die. While the regions are of equal size, the average spacing $d_2$ between two adjacent wires is generally greater in the regions 704 and 706 than the average spacing $d_1$ in the region 702. That is, the bond pads 210 on the integrated circuit die 202 associated with regions 704 and 706 are coupled to corresponding bond pads 212 on the substrate which are generally farther way along the substrate compared to the bond pads associated with region 702 which more closely align with the bond pads 210 of the integrated circuit die 202.

If it is determined that the wire bonds in the regions 704 and 706 do not experience shorting, it would not be necessary to apply the coating of non-conductive material in those regions. Criteria for applying a non-conductive material to the wire bonds may be determined empirically, such as through analysis of integrated circuit packages which fail testing. The determined criteria may include the length of the wire bonds, the average distance or gap between adjacent wire bonds in a region, the locations of the group of wire bonds with respect to the substrate (e.g. a region of wire bonds near the center of the die), or other criteria associated with a region of wire bonds.

Figure 8:
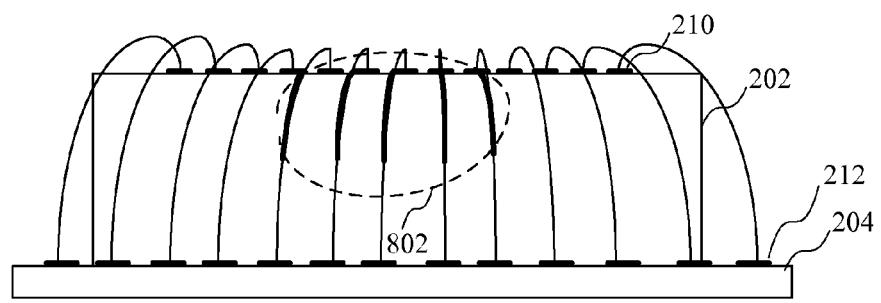
FIG. 8 is a side view of the integrated circuit device of FIG. 7 having a non-conductive material applied to a region of the plurality of wire bonds according to an embodiment.
Figure 9:
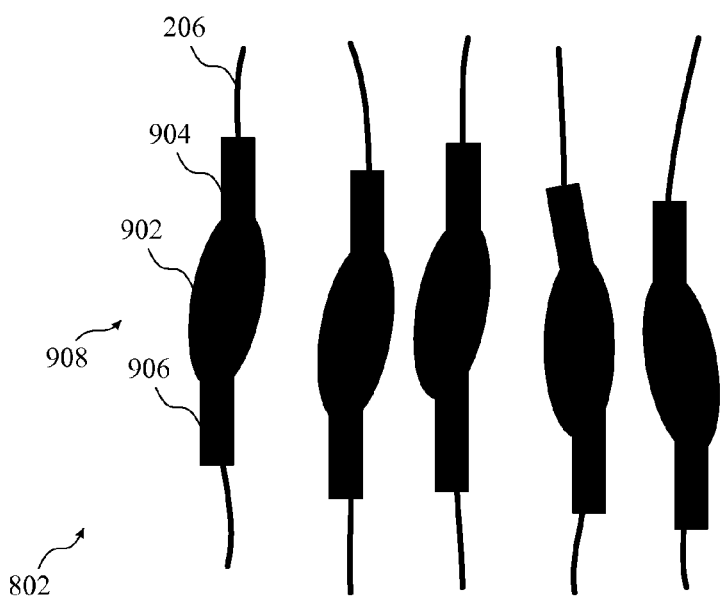
FIG. 9 is an expanded view of the region of wire bonds of FIG. 8 having non-conductive material according to an embodiment.

Turning now to FIGS. 8 and 9, a side view of the integrated circuit device of FIG. 7 having a non-conductive material applied to region 702 is shown, where an enlarged portion 802 of region 702 is shown in FIG. 9. As shown in FIG. 9, a bead 902 is formed between an upper portion 904 and a lower portion 906 of the non-conductive coating element 908. The composition of the non-conductive coating is selected so that the material will wick around the wire to surround the wire and forms a "bead" after heating. The non-conductive material may comprise a combination of an epoxy resin and a hardener which preferably meets the criteria set forth in the following Table 1.

TABLE 1

| Properties | Units | Readings |
| --- | --- | --- |
| Viscosity | Pa · s/25° C. | 70 |
| Thixotropic ratio | | 5.5 |
| Hot plate cure time. | Sec/150° C. | 30 |
| CTE alpha 1 | ppm/° C. | 55 |
| CTE alpha 2 | ppm/° C. | 200 |
| Tg | ° C. | 120 |
| Flexural strength | MPa | 150 |
| Flexural modulus | MPa | 3500 |

The viscosity is selected such that the non-conductive material will wick around the wire bonds to coat all or substantially all of the circumference of the wire bonds. According to one embodiment, the nozzle of the spraying apparatus used to spray the non-conductive material enables the non-conductive material to cover approximately 15%-25% of the circumference of the wire bond before wicking of the non-conductive material. While the embodiment of FIG. 8 shows a region having only a single application of a non-conductive material, it should be understood that similar non-conductive coating elements would result from second application of the non-conductive material, where the second elements would be located where the second coating was applied, such as above or below the elements shown in FIG. 9.

The substrate is preferably heated to above ambient temperature, such as to a temperature of 150° Fahrenheit, for example. For the required placement accuracy, a vision system may be used to align the die with the nozzle dispensing the non-conductive material with the appropriate region of the wire bonds. Epoxy is dispensed onto the wire bonds to apply a coating of the non-conductive material as shown in FIGS. 5 and 6. After curing, the non-conductive material hardens to form beads on the wires that will prevent any movement of the encapsulation material during the molding process.

Figure 10:
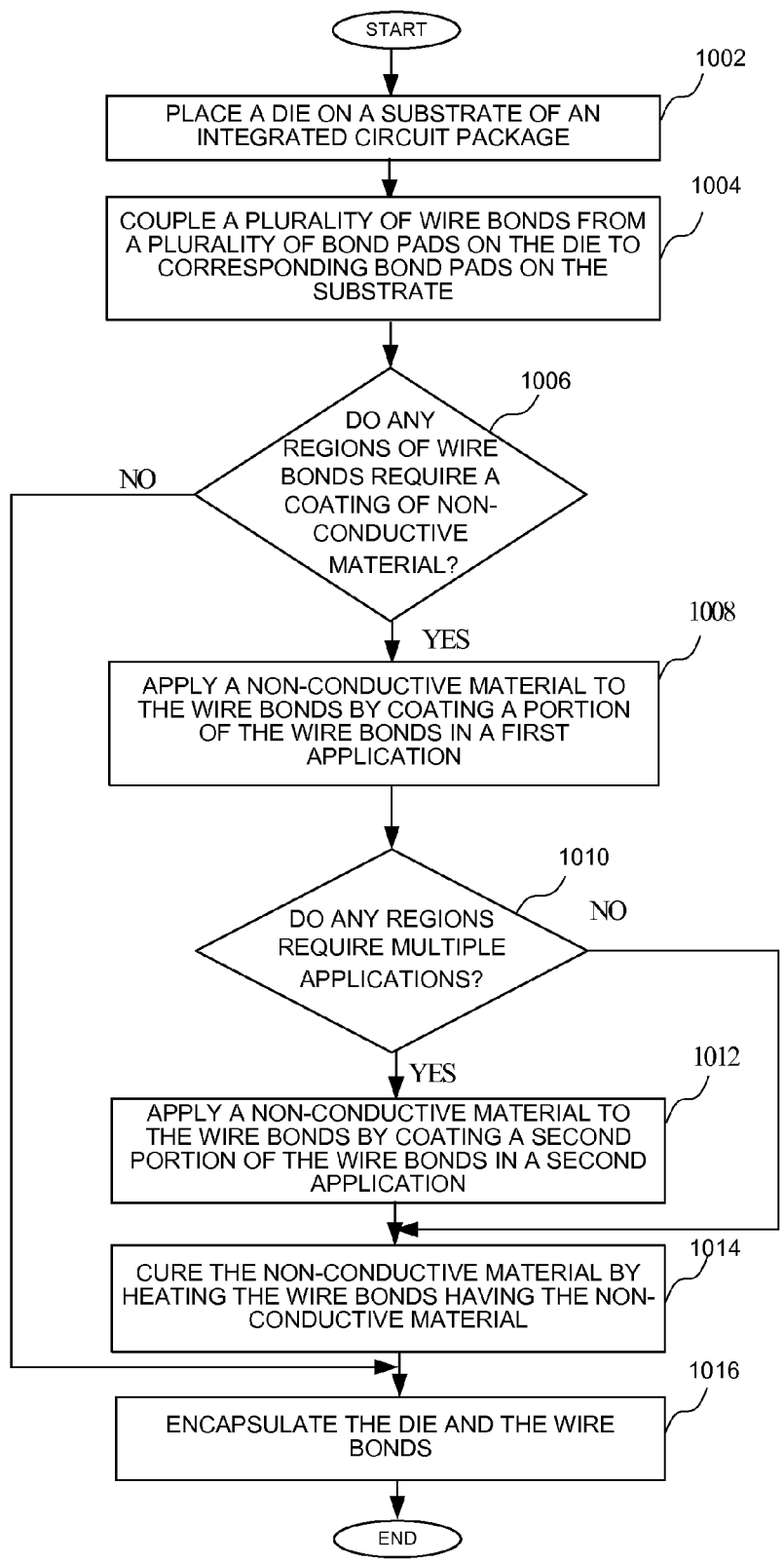
FIG. 10 is a flow chart showing a method of producing an integrated circuit according to an embodiment.

Turning now to FIG. 10, a flow chart shows a method of producing an integrated circuit. In particular, a die is placed on a substrate of an integrated circuit package at a block 1002. A plurality of wire bonds are coupled from a plurality of bond pads on the die to corresponding bond pads on the substrate at a block 1004. It is then determined whether any regions of wire bonds require a coating of non-conductive material at a block 1006. A non-conductive material is then applied to the appropriate wire bonds by coating a portion of the wire bonds in a first application at a block 1008. It is also determined whether any regions require multiple applications at a block 1010. If so, a non-conductive material is applied to the wire bonds by coating a second portion of the wire bonds in a second application at a block 1012. The non-conductive material is cured by heating the wire bonds having the non-conductive material at a block 1014, resulting in beads being formed depending upon the location of the application of the non-conductive material. While the curing is shown being performed after multiple applications of the non-conductive material, curing could be performed after each application of the non-conductive material. The die and the wire bonds are encapsulated by a molding material at a block 1016.

Figure 11:
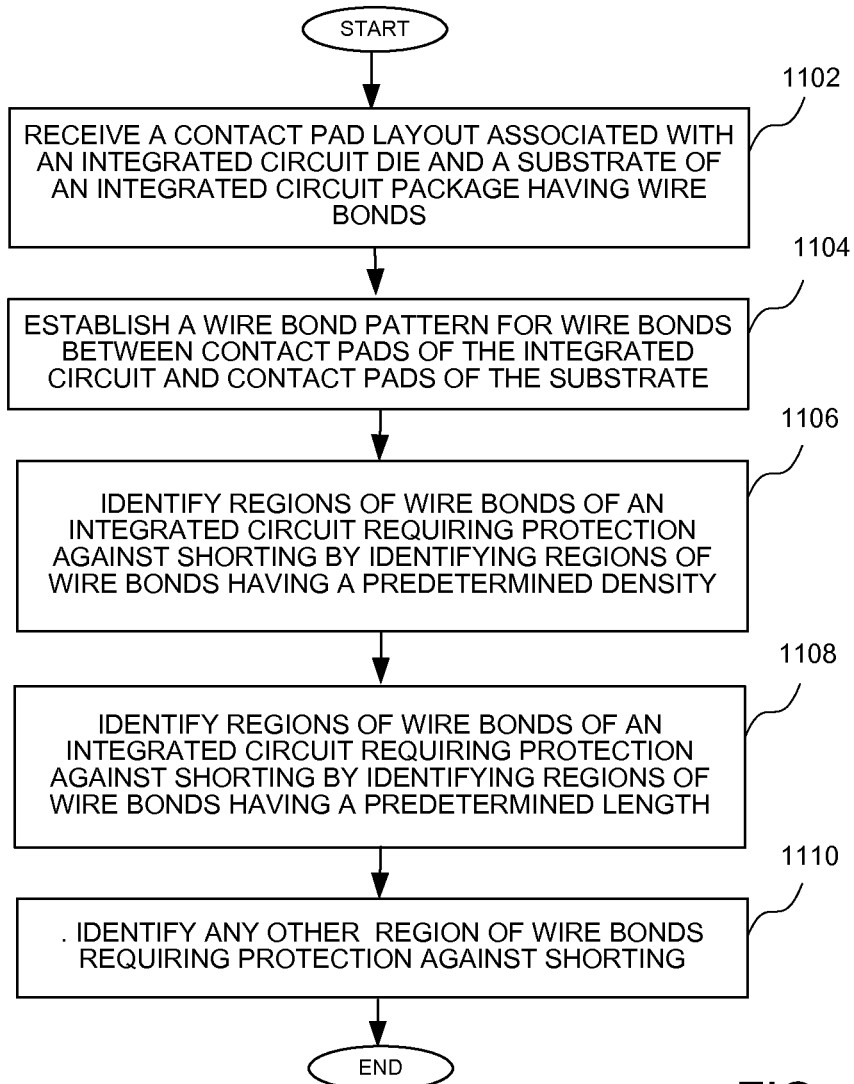
FIG. 11 is a flow chart showing a method of determining one or more regions requiring a non-conductive coating according to an embodiment.

Turning now to FIG. 11, a flow chart shows a method of determining one or more regions requiring a non-conductive coating according to an embodiment the present invention. A bond pad layout associated with an integrated circuit die and a substrate of an integrated circuit package having wire bonds is received at a block 1102. A wire bond pattern for wire bonds between bond pads of the integrated circuit and bond pads of the substrate is established at a block 1104. Regions of wire bonds of an integrated circuit requiring protection against shorting are identified by identifying regions of wire bonds of an integrated circuit having a predetermined density at a block 1106. Regions of wire bonds of an integrated circuit requiring protection against shorting are determined by identifying regions of wire bonds of an integrated circuit having a predetermined length at a block 1108. Any other region of wire bonds of an integrated circuit requiring protection against shorting is identified at a block 1110.

The flow charts of FIGS. 10 and 11 could be implemented according to the embodiments of FIGS. 1-9 as described, for example, and particularly by a computer program having code stored on a non-transitory medium readable by a computer of FIG. 1, for example. While the circuits of FIGS. 10 and 11 include certain elements, additional elements of the method, or additional details of the various elements shown in FIGS. 10 and 11 could be implemented according to the various embodiments described in reference to FIGS. 1-9.

The various embodiments of applying a non-conductive coating have led to significant reductions in defects in the manufacture of integrated circuit packages. For example, while the minimum wire gap of wire bonds before molding in a conventional device may be 44 micrometers (μm), a minimum wire gap of 52 μm may be achieved in a similar device having wire bonds with a coating of non-conductive material as described above, resulting in a 16% improvement. Further, the wire sweep of wire bonds (after the molding process) in a device having a coating of non-conductive material is also significantly reduced. That is, the coating of non-conductive material reduces wire sweep from a maximum of 3.24% to 1.81%, resulting in a 44% improvement. Further, after de-cap of the packaged integrated circuit, the minimum wire gap is increased from 39 μm to 46 μm, resulting in an 18% improvement. A cross-section of the integrated circuit package reveals an improvement in the minimum wire gap from 20 μm to 53 μm, resulting in a 169% improvement. Further, while electrical shorts of wire bonds may account for 2% of packaging defects in conventional devices, the methods set forth above have eliminated any defects in integrated circuit packages resulting from the shorting of wire bonds.

It can therefore be appreciated that the new and novel integrated circuit package and method of assembling an integrated circuit package have been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of assembling an integrated circuit package, the method comprising:
   placing a die on a substrate of the integrated circuit package;
   coupling a plurality of wire bonds from a plurality of bond pads on the die to corresponding bond pads on the substrate;
   applying a plurality of non-conductive coating elements to the plurality of wire bonds, wherein each non-conductive coating element of the plurality of non-conductive coating elements is applied to a corresponding individual wire bond of the plurality of wire bonds; and
   encapsulating the die and the plurality of wire bonds.

2. The method of claim 1, further comprising curing the plurality of non-conductive coating elements by heating the non-conductive material.

3. The method of claim 1, further comprising identifying one or more regions of wire bonds having a high density of wire bonds.

4. The method of claim 3, wherein applying a plurality of non-conductive coating elements to the plurality of wire bonds comprises coating wire bonds in the one or more regions of wire bonds having a high density of wire bonds.

5. The method of claim 1, wherein applying a plurality of non-conductive coating elements to the plurality of wire bonds comprises coating a first portion of the plurality of wire bonds in a first application.

6. The method of claim 5, further comprising coating a second portion of the plurality of wire bonds with a second plurality of non-conductive coating elements in a second application.

7. The method of claim 6, wherein coating a second portion of the plurality of wire bonds with a second plurality of non-conductive coating elements in a second application comprises coating the second portion of the plurality of wire bonds if the plurality of wire bonds exceeds a predetermined length.

8. A method of assembling an integrated circuit package, the method comprising:
   placing a die on a substrate of the integrated circuit package;
   coupling a plurality of wire bonds from a plurality of bond pads on the die to corresponding bond pads on the substrate;
   identifying a region of the plurality of wire bonds of an integrated circuit requiring protection against shorting; and
   selectively applying a plurality of non-conductive coating elements to the region of the plurality of wire bonds, wherein each non-conductive coating element of the plurality of non-conductive coating elements is applied to a corresponding individual wire bond of the plurality of wire bonds.

9. The method of claim 8, further comprising curing the plurality of non-conductive coating elements by heating the plurality of non-conductive coating elements.

10. The method of claim 8, wherein identifying a region of the plurality of wire bonds of an integrated circuit comprises identifying a region of the plurality of wire bonds having a predetermined density of wire bonds.

11. The method of claim 8, wherein identifying a region of the plurality of wire bonds of an integrated circuit comprises identifying a region of the plurality of wire bonds having a predetermined length.

12. The method of claim 8, wherein selectively applying a plurality of non-conductive coating elements to the region of the plurality of wire bonds comprises coating a first portion of the plurality of wire bonds with the plurality of non-conductive coating elements in a first application.

13. The method of claim 12, further comprising coating a second portion of the plurality of wire bonds with a second plurality of non-conductive coating elements in a second application.

14. The method of claim 8, further comprising encapsulating the die and the plurality of wire bonds.

15. An integrated circuit package, comprising:
   a substrate;
   at least one die positioned on the substrate; and a plurality of wire bonds coupling a plurality of bond pads on the at least one die to corresponding bond pads on the substrate;

wherein at least a portion of the plurality of wire bonds are coated with a corresponding plurality of non-conductive coating elements to prevent shorting between wire bonds of the plurality of wire bonds, wherein each non-conductive coating element of the plurality of non-conductive coating elements is applied to a corresponding individual wire bond of the plurality of wire bonds.

16. The integrated circuit package of claim 15, wherein the plurality of wire bonds is in a region of wire bonds having a predetermined density.

17. The integrated circuit package of claim 15, wherein the at least a portion of the plurality of wire bonds is coated with a first coating on first segments of the plurality of wire bonds and with a second coating on second segments of the plurality of wire bonds.

18. The integrated circuit package of claim 15, wherein, for each wire bond of the plurality of wire bonds having the non-conductive coating elements, a bead is formed on the wire bond.

19. The integrated circuit package of claim 15, wherein the at least a portion of the plurality of wire bonds comprises a first plurality of wire bonds in a first region and a second plurality of wire bonds in a second region.

20. The integrated circuit package of claim 15, wherein the non-conductive coating elements comprise an epoxy.

* * * * *